(12) United States Patent
Min et al.

(10) Patent No.: US 8,389,366 B2
(45) Date of Patent: Mar. 5, 2013

(54) RESURF SEMICONDUCTOR DEVICE CHARGE BALANCING

(75) Inventors: Won Gi Min, Chandler, AZ (US); Hongzhong Xu, Gilbert, AZ (US); Zhihong Zhang, Tempe, AZ (US); Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 617 days.

(21) Appl. No.: 12/129,840

(22) Filed: May 30, 2008

(65) Prior Publication Data

US 2009/0294849 A1 Dec. 3, 2009

(51) Int. Cl.
*H01L 29/772* (2006.01)
(52) U.S. Cl. ........................... 438/282; 257/343
(58) Field of Classification Search .......... 257/434, 257/343, 339, E29.256, E29.258; 438/282, 438/526
See application file for complete search history.

(56) References Cited

U.S. PATENT DOCUMENTS

| | | | | |
|---|---|---|---|---|
| 4,929,991 A | * | 5/1990 | Blanchard | 257/339 |
| 5,349,225 A | * | 9/1994 | Redwine et al. | 257/336 |
| 5,365,098 A | * | 11/1994 | Miyamoto et al. | 257/316 |
| 5,430,316 A | * | 7/1995 | Contiero et al. | 257/335 |
| 5,485,027 A | * | 1/1996 | Williams et al. | 257/343 |
| 5,635,742 A | * | 6/1997 | Hoshi et al. | 257/337 |
| 6,501,128 B1 | * | 12/2002 | Otsuki | 257/330 |
| 6,683,347 B1 | * | 1/2004 | Fujihira | 257/341 |
| 6,753,575 B2 | * | 6/2004 | Efland et al. | 257/343 |
| 6,876,035 B2 | * | 4/2005 | Abadeer et al. | 257/343 |
| 6,882,023 B2 | | 4/2005 | Khemka et al. | |
| 7,064,385 B2 | | 6/2006 | Dudek et al. | |
| 7,238,986 B2 | * | 7/2007 | Pendharkar et al. | 257/336 |
| 7,282,765 B2 | * | 10/2007 | Xu et al. | 257/343 |
| 7,466,006 B2 | * | 12/2008 | Khemka et al. | 257/492 |
| 7,626,233 B2 | * | 12/2009 | Tornblad et al. | 257/343 |
| 2002/0070394 A1 | | 6/2002 | Lin et al. | |
| 2005/0082610 A1 | | 4/2005 | Shibib et al. | |

* cited by examiner

*Primary Examiner* — Robert J Hoffberg
*Assistant Examiner* — Ali Naraghi
(74) *Attorney, Agent, or Firm* — Sherry W. Schumm

(57) ABSTRACT

Breakdown voltage BVdss is enhanced and ON-resistance reduced in RESURF devices (40, 60, 80, 80', 80"), e.g., LDMOS transistors, by careful charge balancing, even when body (44, 44', 84, 84') and drift (50, 50', 90, 90') region charge balance is not ideal, by: (i) providing a plug or sinker (57) near the drain (52, 92) and of the same conductivity type extending through the drift region (50, 50', 90, 90') at least into the underlying body region (44, 44' 84, 84'), and/or (ii) applying bias Viso to a surrounding lateral doped isolation wall (102) coupled to the device buried layer (42, 82), and/or (iii) providing a variable resistance bridge (104) between the isolation wall (102) and the drift region (50, 50', 90, 90'). The bridge (104) may be a FET (110) whose source-drain (113, 114) couple the isolation wall (102) and drift region (50, 50', 90, 90') and whose gate (116) receives control voltage Vc, or a resistor (120) whose cross-section (X,Y, Z) affects its resistance and pinch-off, to set the percentage of drain voltage coupled to the buried layer (42, 82) via the isolation wall (102).

14 Claims, 6 Drawing Sheets

RESURF SEMICONDUCTOR DEVICE CHARGE BALANCING

FIELD OF THE INVENTION

The present invention generally relates to reduced surface field (RESURF) means and methods for semiconductor devices and, more particularly, means and methods for charge balancing in RESURF semiconductor devices.

BACKGROUND OF THE INVENTION

It is known that reduced surface field (RESURF) techniques can be applied to various semiconductor devices to improve their voltage breakdown and their series ON-resistance. However, simultaneous optimization of series ON-resistance and breakdown voltage BVdss often requires choices of doping and device geometry that may be unduly restrictive and difficult to achieve consistently in volume manufacturing. Accordingly, there is an on-going need for improved RESURF structures and methods that allow greater flexibility in device design and the charge balancing needed for RESURF behavior.

For convenience of explanation, the improvements described herein are illustrated by means of lateral diffused field effect MOS transistors identified by the abbreviation "LDMOS", but persons of skill in the art will understand that they may be applied to other types of transistors and diodes and are not intended to be limited merely to the exemplary LDMOS transistors. It will be further understood by persons of skill in the art, that the abbreviation "MOS" for "metal-oxide-semiconductor" is not limited merely to field effect structures employing metal gates and oxide insulators, but that any type of conductor may be used for the gates and any type of dielectric for the insulator in such devices.

FIG. 1 is a simplified schematic cross-sectional view of N-channel LDMOS transistor 20, according to the prior art, and FIG. 2 is a simplified plan view of transistor 20. Dimensional arrows are provided in FIG. 2 and other FIGS. to indicate the relative lateral extent of various regions. Transistor 20 comprises substrate 22, P-type body (P BODY) region 24 overlying substrate 22, P+ body contact region 26, N+ source region 28, N-type drift (N DRIFT) region 30 in which is formed N+ drain region 32. Portion 24' of P BODY region 24 underlies N DRIFT region 30. Dielectric region 34 extending partly under conductive gate 38 is generally placed in N DRIFT region 30 adjacent N+ drain region 32. Gate dielectric 36 separates conductive gate 38 from semiconductor surface 21. P BODY region 24 and source region 28 are often shorted together and external body-source (B/S) terminal 29 is generally provided to body contact region 26 and source region 28. Gate (G) terminal 39 is provided to conductive gate 38. Drain (D) terminal 33 is provided to drain region 32. As noted in FIG. 1, electron current Ids flows between source region 28 and drain region 32, when device 20 is appropriately biased. In order to obtain RESUF action, the charge in N DRFT region 30 and underlying portion 24' of P BODY region 24 should be approximately balanced. In the prior art, this is usually accomplished by appropriately choosing thickness 25' and doping of P BODY region 24' and thicknesses 31, 35 and doping of N DRIFT region 30. Double RESURF action can be provided by having an N-type region, e.g., an N-type buried layer (BL) (not shown) at the interface between P-BODY region 24 and substrate 22.

BRIEF DESCRIPTION OF THE DRAWINGS

The present invention will hereinafter be described in conjunction with the following drawing figures, wherein like numerals denote like or analogous elements, and wherein.

DETAILED DESCRIPTION OF THE INVENTION

Figure 1:
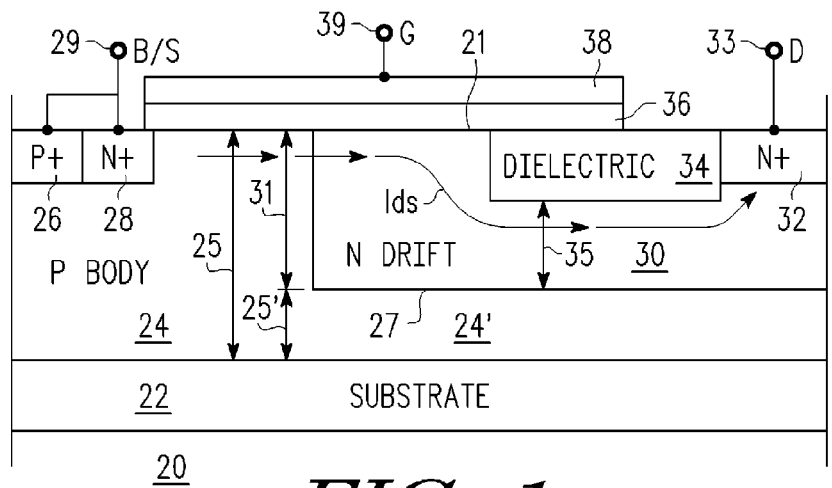
FIG. 1 is a simplified schematic cross-sectional view of an LDMOS transistor, according to the prior art.

The following detailed description is merely exemplary in nature and is not intended to limit the invention or the application and uses of the invention. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawings figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus. The term "coupled," as used herein, is defined as directly or indirectly connected in an electrical or non-electrical manner.

Figure 2:
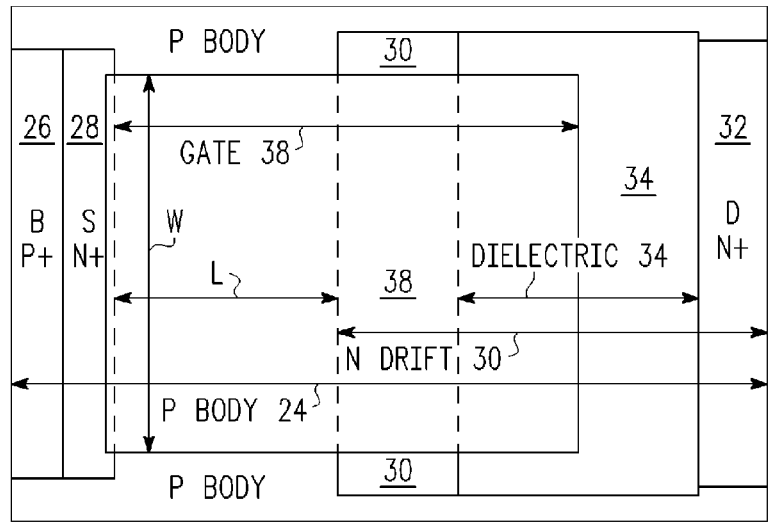
FIG. 2 is a simplified plan view of the transistor of FIG. 1.

While the structures of FIGS. 1-2 can be effective in providing RESURF transistors and diodes, further improvements are needed. Accordingly, there is an ongoing need to provide improved RESURF semiconductor devices, especially LDMOS transistors and diodes wherein higher breakdown voltage BVdss and lower ON resistance are simultaneously obtained. Further it is desirable to reduce or eliminate latch-up problems associated with buried layers in double RESURF devices, and neutralization of parasitic bipolar transistors often associated with such LDMOS devices or diodes. It is still further desirable that some or all of the above-noted improvements can be obtained with a wider variety of doping and thickness of the various LDMOS device regions, that is, by being able to provide charge balancing for optimal RESURF action by other than or in addition to precise control of doping and thicknesses of the concerned regions. For example, and not intended to be limiting, by using mask changes alone or using mask changes in conjunction with doping levels that facilitate building other devices on the same substrates, and/or by adjusting the electric potential of various regions so as facilitate the desired charge balancing and depletion needed for RESURF action. Furthermore, other desirable features and characteristics of the present invention will become apparent from the subsequent detailed description of the invention and the appended claims, taken in conjunction with the accompanying drawings and this background of the invention.

For convenience of description, it is assumed herein that the LDMOS devices illustrated herein are N-channel field effect transistors. But this is not intended to be limiting, and persons of skill in the art understand that P-channel devices can also be utilized with an appropriate interchange of N and P semiconductor regions and polarity of applied voltages. Accordingly, the description herein embodying various N-channel field effect transistors (FETs) and N-channel LDMOS devices is intended to apply to either type of device with appropriate modification of doping type and applied voltages. Thus, various device regions can more appropriately be referred to as of a first semiconductor or first conductivity type and a second, opposite, semiconductor or conductivity type, where the first type can be either N or P and the second type therefore P or N, and so forth for other semiconductor regions.

Figure 3:
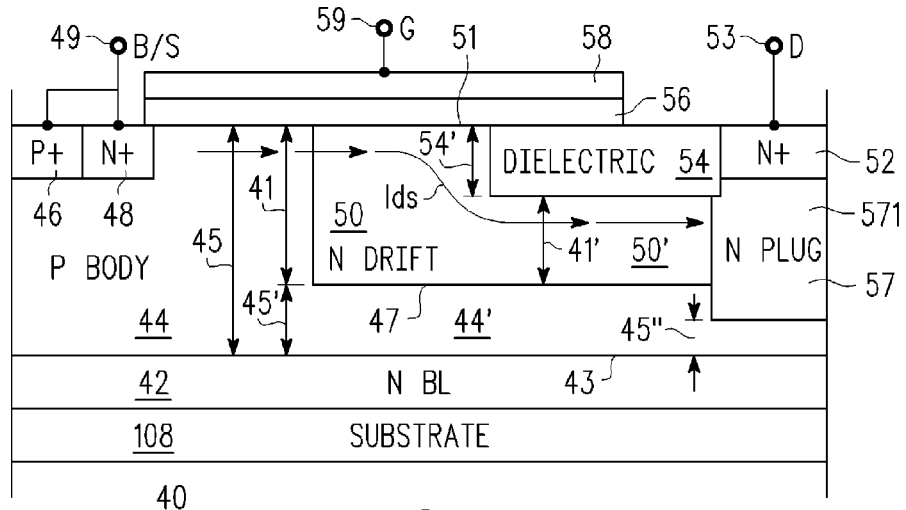
FIG. 3 is a simplified schematic cross-sectional view of an LDMOS transistor, according to an embodiment of the present invention.
Figure 4:
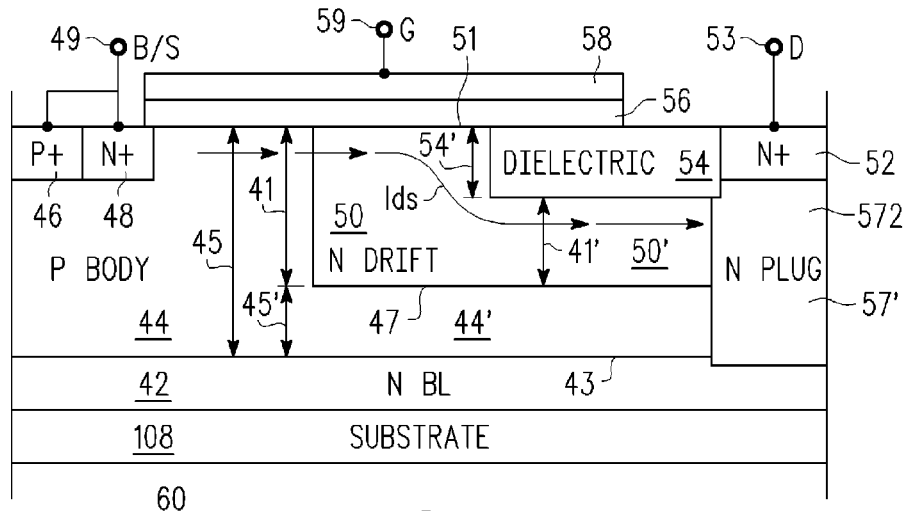
FIG. 4 is a simplified schematic cross-sectional view of an LDMOS transistor, according to a further embodiment of the present invention.
Figure 5:
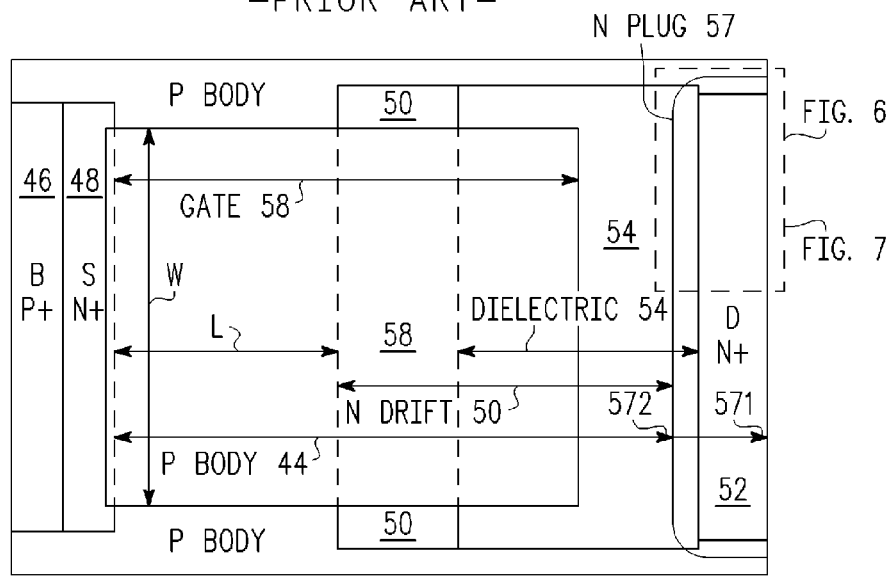
FIG. 5 is a simplified plan view of the transistors of FIGS. 3-4.

FIGS. 3-4 are simplified schematic cross-sectional views of LDMOS transistors 40, 60 according to embodiments of the present invention and FIG. 5 is a simplified plan view of the transistors of FIGS. 3-4. Since transistors 40, 60 of FIGS. 3-5 have many regions in common they are described together. Transistors 40, 60 comprise substrate 108, N-type buried layer (N BL) region 42 overlying substrate 108, P-type body (P BODY) region 44 overlying N BL region 42, P+ body contact region 46, N+ source region 48, N-type drift (N DRIFT) region 50 in which is formed N+ drain region 52. Portion 50' of N DRIFT region 50 underlies dielectric region 54. Portion 44' of P BODY region 44 underlies N DRIFT region 50, 50'. Dielectric region 54 is generally placed in N DRIFT region 50 adjacent surface 51, extending from N+ drain region 52 partly under gate 58 in the upper portion of N DRIFT region 50. Gate dielectric 56 separates conductive gate 58 from semiconductor surface 51. P BODY 44 and source region 48 are often shorted together by a common metallization over regions 46, 48 and common external body-source (B/S) terminal 49 is generally provided. In other embodiments, regions 46, 48 may be contacted separately and have separate terminals. Gate (G) terminal 59 is provided to conductive gate 58. Drain (D) terminal 53 is provided to drain region 52. Junction 43 is formed between N BL region 42 and P BODY region 44. Junction 47 is formed between P BODY region 44, 44' and N DRIFT region 50, 50'.

N BL region 42 is conveniently doped to an average doping density in the range of about 5E16 to about 5E20 atoms/cm$^3$, more conveniently in the range of about 1E18 to about 1E20 atoms/cm$^3$, with about 1.5E19 atoms/cm$^3$, more or less, being preferred. P BODY region 44, 44' usefully has an average doping density in the range of about 1E16 to about 5E18 atoms/cm$^3$, more conveniently in the range of about 1E17 to about 1E18 atoms/cm$^3$ with about 2-3E17/cm$^3$, more or less, being preferred. Thickness 45 between surface 51 and junction 43 is usefully in the range of about 0.2 to 10 micrometers, more conveniently in the range of about 0.6 to 3 micrometers and preferably about 1.6 micrometers, more or less, but thicker and thinner layers can also be used. Thickness 45' between junction 47 and junction 43 is usefully about 0.2 to 5 micrometers, more conveniently about 0.4 to 2 micrometers and preferably about 0.5 micrometers. Dielectric region 54 has thickness 54' usefully about 0.1 to 1 micrometers, more conveniently about 0.3 to 0.6 micrometers and is preferably about 0.5 micrometers thick approximately perpendicular to surface 51. N DRIFT region 50 usefully has an average doping density in the range of about 1E16 to about 2E18 atoms/cm$^3$, more conveniently in the range of about 5E16 to about 5E17 atoms/cm$^3$ with about 1E17 atoms/cm$^3$, more or less, being preferred. Thickness 41 of N DRIFT region between surface 51 and junction 47 is usefully about 0.2 to 2 micrometers, more conveniently about 0.5 to 2 micrometers and preferably about 1.0 micrometers thick, more or less. Thickness 41' between the lower surface of dielectric region 54 and junction 47 is usefully about 0.1 to 2 micrometers, more conveniently about 0.5 to 1 micrometers and preferably about 0.5 micrometers thick, more or less. Stated another way, it is desirable that N DRIFT region 50 have doping that is about the same or slightly smaller than the doping of P BODY region 44, which has a doping density about an order of magnitude less than the doping density of N BL region 42.

Electron current Ids flows between source region 48 and drain region 52, when devices 40, 60 are appropriately biased. In order to obtain RESUF action, the charge in N DRIFT region 50 and underlying portion 44' of P BODY region 44 should be approximately balanced. The present invention accomplishes this in several unique ways. Transistor 40 of FIGS. 3-5 accomplishes this by adding N-type sinker region or plug (N PLUG) region 571 (see FIG. 3) or 572 (see FIG. 4), collectively referred to as N-type sinker region or N PLUG region 57, that extends from N+ drain (D) region 52 through N DRIFT region 50 into underlying P BODY region 44'. As used herein, the words "sinker region" and "plug region" and the abbreviation "PLUG" are intended to be equivalent. In transistor 40 of FIG. 3, N PLUG 571 extends part way through portion 44' of P BODY region 44, so as to be separated from junction 43 between P BODY region 44 and N BL region 42 by distance 45". Distance 45" is usefully about 0.1 to 2 micrometers, more conveniently about 0.1 to 0.5 micrometers and preferably about 0.2 micrometers, more or less. In transistor 60 of FIG. 4, N-type sinker region or plug (N PLUG) region 572 extends fully through portion 44' of P BODY region 44, so as to ohmically contact N BL region 42. Either arrangement is useful. The extent to which P BODY 44, 44' extends laterally (left-right) is indicated by reference numbers 571, 572 on the P BODY dimensional arrow heads at the right of FIG. 5. The left-right lateral extent of N DRIFT region 50 and dielectric region 54 are similarly identified by their respective dimensional arrow in FIG. 5. The channel length (L) and the channel width (W) of transistors 40, 60 are indicated by the letters "W" and "L" in FIGS. 2 and 5. The same convention is also used in the plan views of FIGS. 12 and 14.

Figure 6:
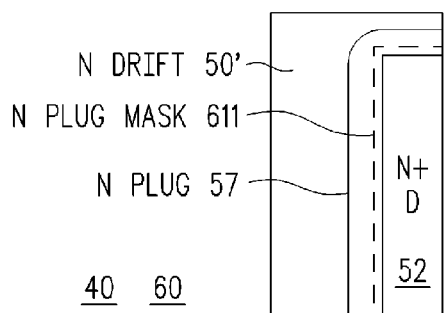
FIGS. 6-7 are simplified plan views of a portion of the transistors of FIG. 5 according to still further embodiments of the present invention.
Figure 7:
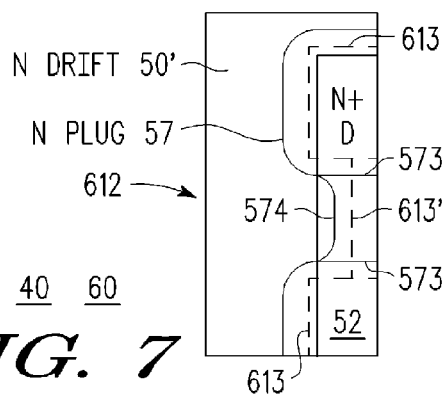

FIGS. 6-7 show simplified plan views of a portion of transistors 40, 60 of FIG. 5 as indicated by the dashed outline at the upper right corner of FIG. 5, according to still further embodiments of the present invention. FIG. 6 illustrates the situation where N-type sinker region or N PLUG MASK opening 611 has a shape substantially similar to that of N+ drain region 52. Due to lateral diffusion beneath dielectric region 54, N PLUG regions 571, 572 (collectively 57) extend laterally into N DRIFT region 50' and P BODY region 44', as indicated in FIGS. 3-6, taken together. FIG. 7 shows substantially analogous information as FIG. 6 but for a different shape of N PLUG mask 612. In FIG. 7, N PLUG MASK 612 has, in one embodiment, the lateral shape of isolated rectangles as denoted by dashed rectangles 613 and in another embodiment, rectangles 613 are connected by a narrower region 613' to give a crenellated shape. The larger rectangles 613 extend further toward N DRIFT region 50, 50' and P BODY region 44, 44' so that the interface with N DRIFT region 50' and P BODY region 44' has a globular or corrugated shape, as indicated for example by the lateral outline of N PLUG region 57 in FIG. 7, where region 573 identifies the globular shape and outline 574 the corrugated shape (collectively 57). This increases the effective drain area or drain periphery in the direction perpendicular to Ids current flow, thereby avoiding or reducing adverse current crowding effects at high current densities. As shown in FIG. 3, N PLUG region 571 extends into but not through P BODY region 44' and, as shown in FIG. 4, N PLUG region 572 extends through P BODY region 44' so as to make ohmic contact with N BL region 42. With the configuration of N PLUG 571 of FIG. 3, N BL region 42 is left floating with respect to drain 52. With the configuration of N PLUG region 572 of FIG. 4, N BL region 42 is ohmically coupled to drain region 52. N PLUG region 57 is conveniently doped to an average doping density in the range of about 2E16 to about 5E18 atoms/cm$^3$, more conveniently in the range of about 5E16 to about 2E18 atoms/cm$^3$, with about 1E18 atoms/cm$^3$, more or less, being preferred. In further embodiments, N PLUG region 57 may have a graded doping, decreasing as a function of depth. Stated another way, it is desirable that N-PLUG region 57 have an average doping density that is greater than the doping density of N DRIFT region 50 and P BODY region 44' and less than the doping density of N+ drain region 52.

Figure 8:
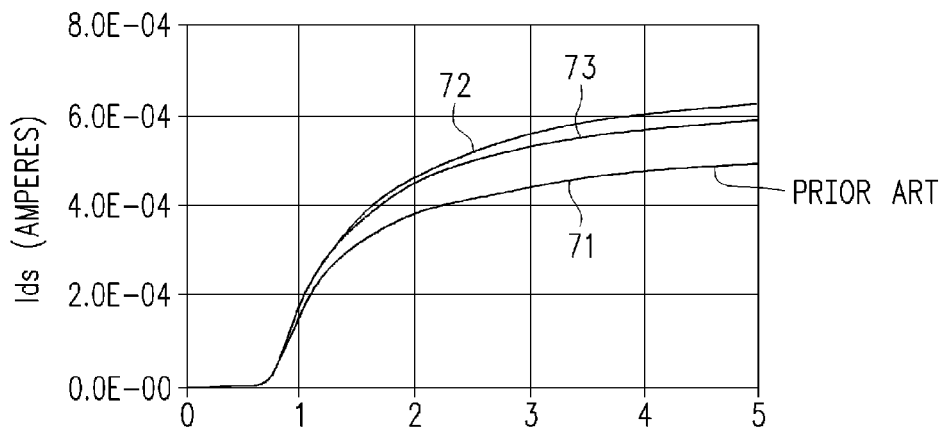
FIG. 8 is a plot of source-drain current Ids in Amperes as a function of the gate voltage Vgs comparing the performance of the embodiment of FIGS. 3, 5-7 with that of the prior art device of FIGS. 1-2.

FIG. 8 shows plot 70 of source-drain current Ids in Amperes as a function of the gate voltage Vgs in volts, at constant source-drain voltage Vds ~0.1 volts, comparing the performance of the embodiments of FIGS. 3, 5-7 with that of the prior art embodiment of FIGS. 1-2. Trace 71 shows the behavior of prior art LDMOS transistor 20 of FIGS. 1-2. Trace 72 shows the behavior of LDMOS transistor 40 of FIGS. 3, 5, and 6 according to an embodiment of the present invention. Trace 73 shows the behavior of LDMOS transistor 40 of FIGS. 3, 5, and 7 according to a further embodiment of the present invention. Other than the implementation of N-PLUG regions 57 in devices 40, devices 20 and 40 were otherwise substantially the same and tested under the same conditions. It will be noted that, other things being equal, devices 40 with N PLUG region 751 according to FIG. 6 or FIG. 7, exhibited lower ON-resistance than the prior art structure.

Figure 9:
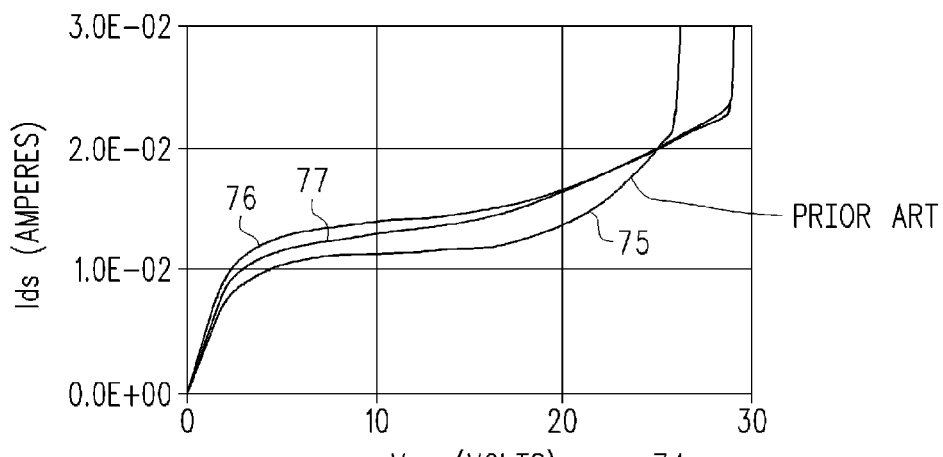
FIG. 9 is a plot of source-drain current Ids in Amperes as a function of the source-drain voltage Vds, comparing the performance of the embodiment of FIGS. 3, 5-7 with that of the prior art device of FIGS. 1-2.

FIG. 9 shows plot 74 of source-drain current Ids in Amperes as a function of the source-drain voltage Vds in volts, at constant gate voltage Vgs=5.1 volts, comparing the performance of the embodiment of FIGS. 3, 5-7 with that of the prior art device of FIGS. 1-2. These are the same three physical devices for which Ids versus Vgs at constant Vds is illustrated in FIG. 8. Trace 75 shows the behavior of prior art LDMOS transistor 20 of FIGS. 1-2. Trace 76 shows the behavior of LDMOS transistor 40 of FIGS. 3, 5, and 6 according to an embodiment of the present invention. Trace 77 shows the behavior of LDMOS transistor 40 of FIGS. 3, 5, and 7 according to a further embodiment of the present invention. Other than the implementation of N-PLUG region 57 in devices 40, devices 20 and 40 were otherwise substantially the same and tested under the same conditions. It will be noted that, other things being equal, devices 40 with N PLUG region 751 according FIG. 6 or FIG. 7, exhibited higher saturation current and higher safe operating area than the prior art structure. The ON resistance decrease is believed to be due to the increased doping in N DRIFT 50 and reduction of sheet resistance provided by including N PLUG 57 in N DRIFT 50. Higher doping on the drain side also mitigates the Kirk effect during high voltage/high current operation. The electric field associated with N PLUG 57 is not as high as the field that would otherwise occur at N+ drain 52 without N PLUG 57. Because there is less impact ionization with N PLUG 57, the device can handle higher saturation current than prior art device 20. At about Vgs=5 volts the gain is increased by 10%. At Vds=15 volts, the ON-resistance is reduced by 33%. This is accompanied by about an approximately 11% increase in the breakdown voltage BVdss. These significant beneficial effects on gain, ON-resistance and breakdown voltage BVdss cannot be due to any slight reduction in the drift path length that might be due the small lateral diffusion of N PLUG region 57 since, while a reduction in the drift path length might tend to slightly reduce the ON-resistance, it should also reduce the breakdown voltage BVdss and not have any significant effect on the gain, which is not what is observed with the test devices.

Figure 10:
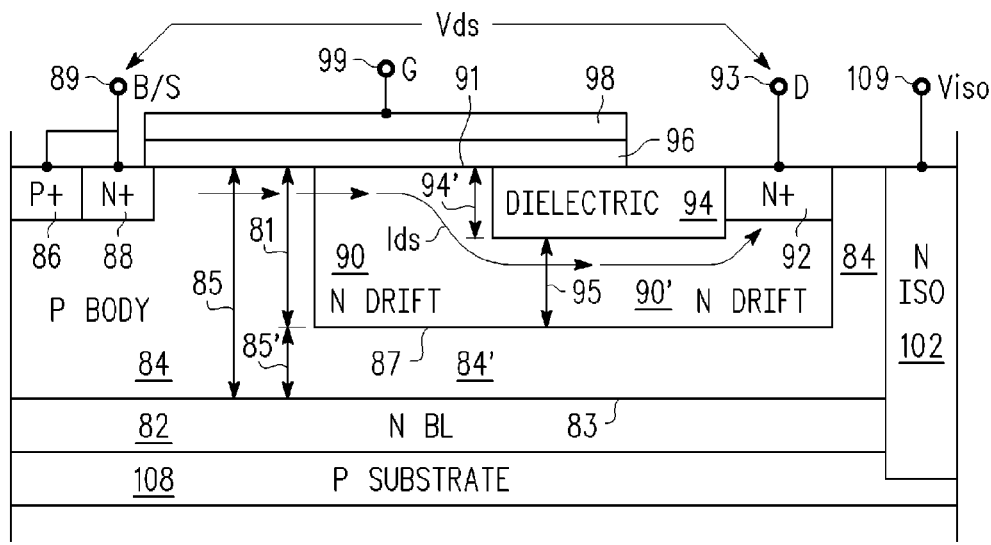
FIG. 10 is a simplified schematic cross-sectional view of a portion of an LDMOS transistor according to another embodiment of the present invention.
Figure 11:
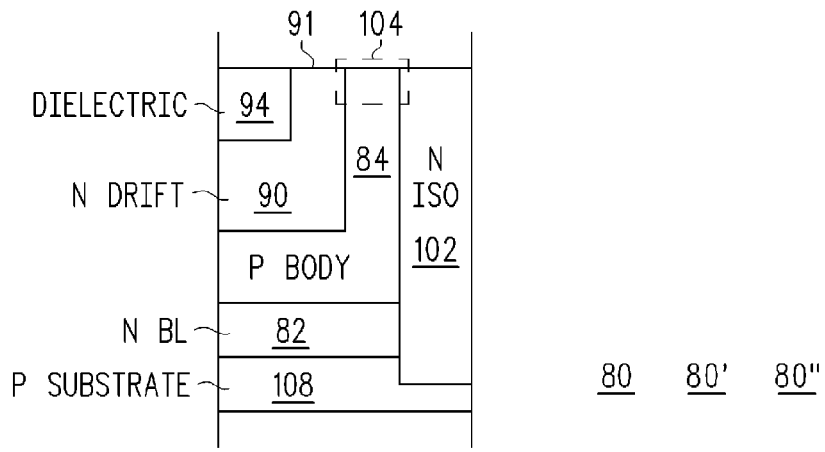
FIG. 11 is a simplified schematic cross-sectional view of another portion of the LDMOS transistor of FIG. 10, at approximately right angle to that of FIG. 10.
Figure 12:
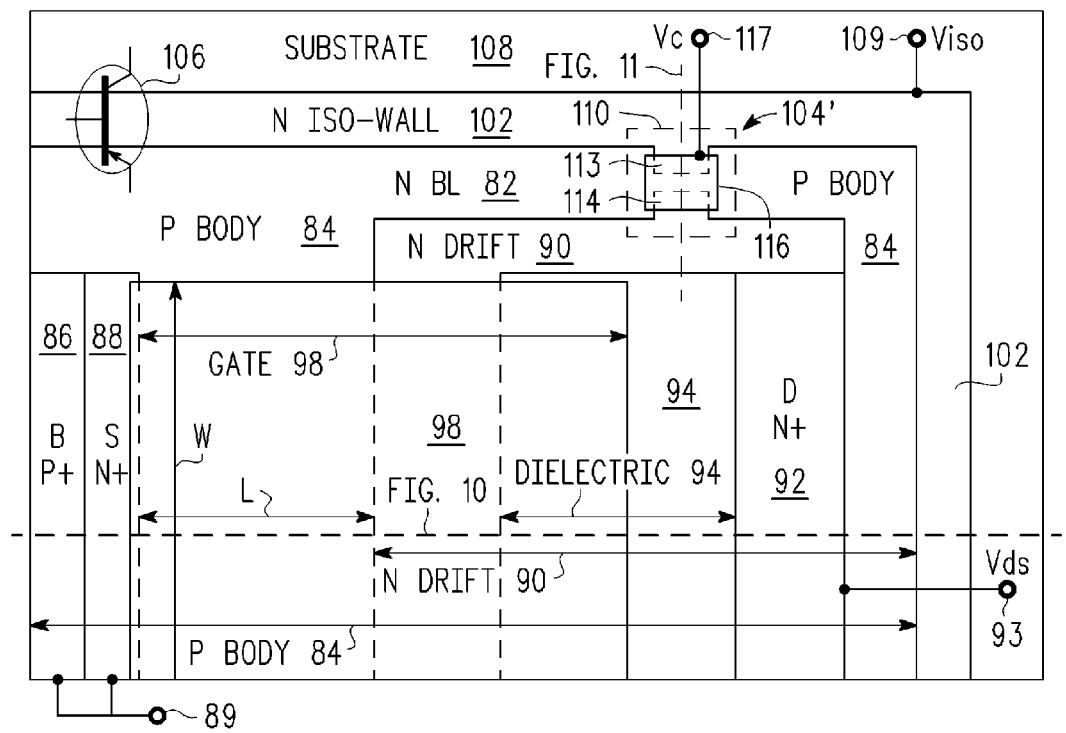
FIG. 12 is simplified plan view of the transistor of FIGS. 10-11 including an N-type isolation (N-ISO) wall, illustrating the occurrence of a parasitic bipolar transistor and additional means for charge balancing and neutralizing the parasitic transistor by coupling the N DRIFT region and the N ISO wall, according to a yet still further embodiment of the present invention.
Figure 13:
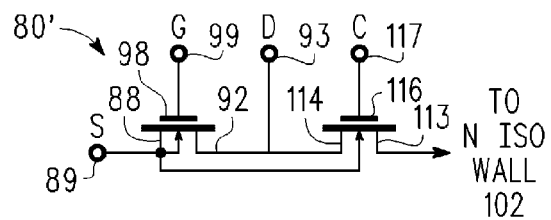
FIG. 13 is a simplified electrical schematic of the transistor arrangement illustrated physically in FIGS. 10-12.
Figure 14:
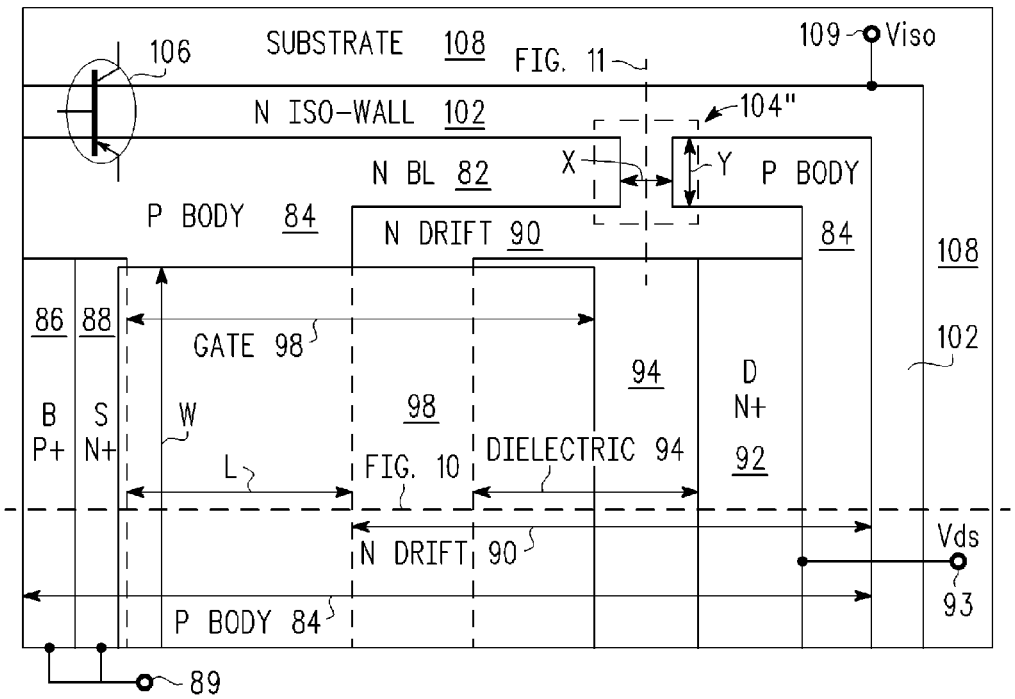
FIG. 14 is simplified plan view analogous to that of FIG. 12, but according to a still yet further embodiment of the present invention.

FIG. 10 shows a simplified schematic cross-sectional view of a portion of LDMOS transistor 80, 80', 80" according to another embodiment of the present invention. FIG. 11 shows a simplified schematic cross-sectional view of another portion of the LDMOS transistor of FIG. 10, at approximately right angle to that of FIG. 10. FIGS. 12 and 14 are simplified plan views of LDMOS transistors 80', 80', 80" of FIGS. 10-11, according to several further embodiment of the present invention. Heavy dashed lines "10" and "11" in FIGS. 12, 14 indicate the planes along or parallel to which the cross-sectional views of FIGS. 10 and 11 are taken. They are substantially at right angles. Referring now to FIGS. 10-14 collectively, transistors 80, 80', 80" comprises P-type substrate 108, N-type buried layer (N BL) region 82 on substrate 108, P-type body (P BODY) region 84 overlying N BL region 82. Included in P BODY region 84 are P+ body contact region 86, N+ source region 88 and N-type drift (N DRIFT) region 90 in which is formed N+ drain region 92. Dielectric region 94 is generally placed in N DRIFT region 90 adjacent surface 91 and extends from N+ drain region 92 under gate 98 in the upper portion of N DRIFT region 90. Gate dielectric 96 separates gate 98 from semiconductor surface 91. Contact region 86 to P BODY region 84 and source region 88 are often shorted together by a common metallization and common external body-source (B/S) terminal 89 is generally provided, but connections to source region 88 and body contact region 86 may also be made separately in other embodiment. Portion 84' of P BODY region 84 extends beneath N DRIFT region 90. Portion 90' of N DRIFT region 90 extends beneath dielectric region 94. Gate (G) terminal 99 is provided to gate 98. Drain (D) terminal 93 is provided to drain region 92. Junction 83 is formed between N BL region 82 and P BODY region 84, 84'. Junction 87 is formed between P BODY region 84, 84' and N DRIFT region 90, 90'. Device 80, 80', 80" further includes N-type isolation (N ISO) wall 102, laterally surrounding device 80, 80', 80". Regions 82, 84, 84' 86, 88, 90, 90' 92, 95, 96, 98 and terminals 89, 93, 99 are analogous to regions 42, 44, 44' 46, 48, 50, 52, 55, 56, 58 and terminals 49, 53, 59 of FIGS. 3-4. N PLUG region 57 is not included in the preferred embodiment of device 80, 80', 80" but is not precluded. It has been found that improved charge equalization and improved RESURF action can be obtained by biasing N ISO wall 102 (and therefore N BL region 82) with respect to N DRIFT region 90 of device 80, 80', 80" (or vice versa). This may be accomplished in several ways illustrated in FIGS. 10-14. For example, with device 80 of FIG. 10, improved charge balancing is obtained by coupling an external voltage source to terminal 109 of N ISO wall 102. In the case of devices 80' and 80" of FIGS. 10-12 and 14 improved charge balancing is obtained by providing "bridge" 104 to couple N ISO wall 102 to N DRIFT region 90 (and therefore also to N+ drain region 92), one or the other of which may be coupled to a voltage source, according to several further embodiments of the invention.

For convenience, the device of FIG. 12 is referred to as device 80' and the device of FIG. 14 is referred to as device 80". Device 80' employs bridge 104' and device and 80" employs bridge element 104", collectively bridge element 104, illustrated in FIGS. 11-12 and 14. Bridge element 104 is not needed for the operation of device 80 of FIG. 10. FIG. 13 is a simplified electrical schematic of the transistor arrangement illustrated physically in FIGS. 10-12 utilizing MOSFET or other FET 110 (see FIG. 12) for bridge element 104'. For convenience of description of their similar elements, FIGS. 10-14 are discussed together and their differences, examined later. Referring now to FIGS. 10-14 collectively, devices 80, 80', 80" have a cross-section and plan view similar to that of FIGS. 1-2, but with the N ISO wall 102 explicitly shown and with the addition of bridge element 104. (N-ISO wall 102 illustrated in FIGS. 10-14 is present and surrounds devices 20, 20, 60 of FIGS. 1-7 but is not explicitly shown therein.) Bridge element 104 in FIGS. 11-14 electrically couples N ISO wall 102 and N DRIFT region 90 in devices 80', 80" of FIGS. 11-14. N ISO wall 102 is generally relatively highly doped, usefully in the range of about 1E17 to 1E19 atoms/cm$^3$, more conveniently in the range of about 5E17 to 5E18 atoms/cm$^3$ and preferably about 1E18 atoms/cm$^3$. N BL region 82 extends laterally underneath P Body region 84, and is ohmically coupled to N ISO wall 102 as shown in FIGS. 10-11. Substrate 108 is shown here as lying beneath N BL region 82 and laterally outside of N ISO wall 102 (see FIGS. 10-11, 12-14) and is desirably electrically isolated therefrom so as to not interfere with the operation of devices 80, 80', 80". If a semiconductor is used for substrate 108, it is desirably P-type so as to be isolated from N BL region 42 by the associated PN junction. By biasing N ISO wall 102 with respect to N DRIFT region 90 (or vice versa) improved charge equalization can be obtained without precise adjustment of the doping concentrations in P BODY region 84, 84' and N DRIFT region 90, 90'. This is a great convenience when other manufacturing considerations (e.g., fabricating a variety of different devices on the same substrate) make it difficult or impossible to use the doping concentrations in P BODY region 84, 84', N DRIFT region 90, 90' and N BL 82 that would otherwise be required for complete charge equalization and single or double RESURF action in devices 80, 80', 80".

Figure 17:
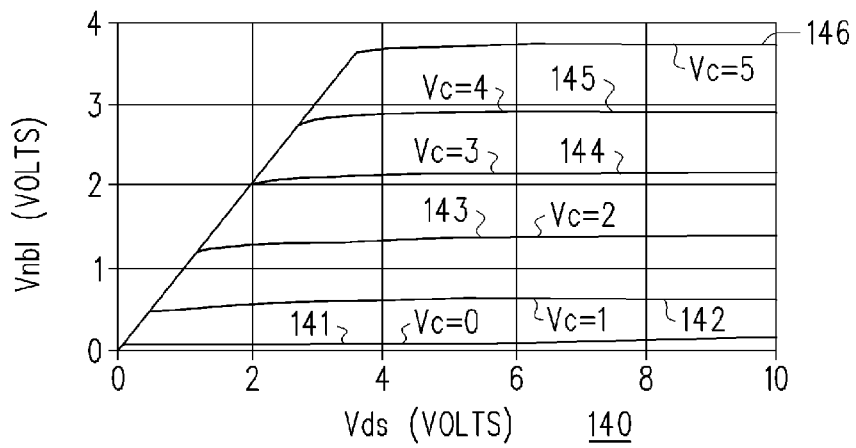
FIG. 17 is a plot of the N BL voltage Vnbl in volts as a function of the source-drain voltage Vds in volts for different values of control voltage Vc applied to a bridging transistor coupling the N ISO wall to the N DRIFT region of the device of FIGS. 10-13.

In FIG. 12, device 80' includes bridge element 104' comprising lateral transistor 110, as for example and not intended to be limiting, a field effect transistor (FET) or MOSFET, having drain or (source), 113 source (or drain) 114, and gate 116. Drain or (source) 113 is conveniently coupled to N ISO wall 102 and source (or drain) 114 is coupled to N DRIFT region 90. This arrangement is illustrated schematically in FIG. 13 where the same reference numbers are used to identify the various regions and terminals as in FIGS. 10-12. Gate 116 is conveniently coupled to terminal 117 where control voltage Vc can be applied. By varying control voltage Vc applied to gate 116 of MOSFET 110, the bias applied to N DRIFT region 90 and therefore the charge equalization can be varied. In many analog ICs, a variety of voltage nodes elsewhere on the same IC die are generally available to bias gate 116 of MOSFET 110. The voltage applied to gate 116 or gate terminal 117 is limited by the dielectric strength of the gate dielectric of bridging MOSFET 110. The isolation wall voltage Viso and the N BL voltage Vnbl follows the voltage of N DRIFT region 90 of device 80' until the drain voltage is same or higher than the bias on gate 116 of MOSFET 110. Viso will be pinned to the gate bias of MOSFET 110 even if the drain voltage of device 80' keeps increasing beyond the gate voltage of MOSFET 110. This situation is illustrated in FIG. 17.

In FIG. 14, device 80" includes bridge element 104" comprising diffused resistor, or thin film resistor 120 coupling N ISO wall 102 and N drift region 90. Region 120 is desirably a diffused region that can be pinched off by, for example, changing the length Y, the width X and/or the depth Z (not shown) perpendicular to the plane of FIG. 14 of region 120 in P BODY region 84, but thin film resistors of dimensions X, Y and Z may also be used. Resistance region 120 can be used to determine the fraction of the voltage on N DRIFT 90 that is coupled to N ISO wall 102 (and thence to N BL region 82), and therefore the degree of charge balancing that is obtained can be predetermined. For example, a mask change altering width X can be used to alter the bias that is coupled from N DRIFT region 90 by, for example, changing the amount of region 120 that is pinched-off. During the ON-state, the drain is electrically coupled to N ISO wall 102 so that the action of parasitic bipolar transistor 106 is suppressed, especially for high-side device operation. During the OFF-state, the drain potential is high compared to source/body terminal 89. In this situation, region 120 which is tied to drain 92 is in reverse biased, and as a result, region 120 will be depleted. A portion of the drain potential is dropped across the depletion region associated with diffused region 120 by the space charge in that region. The potential of N ISO wall 102 and N BL region 82 is determined by the voltage of drain region 92 and the voltage drop associate with region 120. The charge balancing voltage in DRIFT region 90 and P BODY 84 can be controlled by layout (dimensions X, Y, Z) and/or doping of region 120, whether it has thin film or bulk form. During the ON-state, N ISO wall 102 will be coupled to drain region 92 so that Viso=Vds. Both device 80' of FIG. 12 and device 80" FIG. 14 improve the charge equalization and performance of the associated devices, by modulating the potential of N ISO wall 102 (and therefore also the potential of N BL 82) relative to the voltage Vds by means of bridge 104, in a predictable and predetermined manner.

Figure 15:
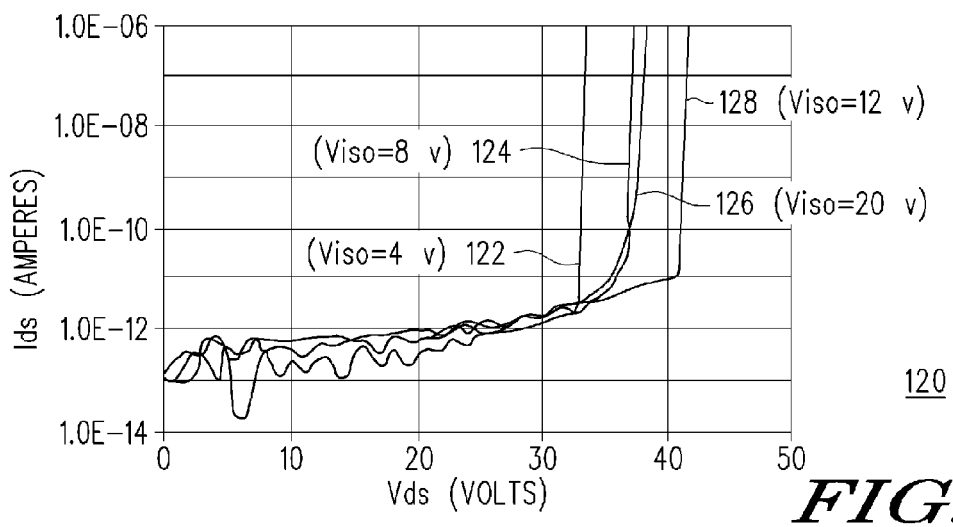
FIG. 15 is a is a plot of source-drain current Ids in Amperes as a function of the source-drain voltage Vds in volts for different values of voltage bias applied to the N ISO wall of the device of FIG. 10.

FIG. 15 shows plot 120 of source-drain current Ids in Amperes as a function of the source-drain voltage Vds in volts, at constant gate voltage Vgs zero volts of device 80 of FIG. 10, for different values of Viso in volts and without bridge 104 or N-PLUG region 57. Trace 122 corresponds to Viso=4 volts, trace 124 to Viso=8 volts, trace 126 to Viso=12 volts and trace 128 to Viso=20 volts. N BL region 82 was Ohmically coupled to N ISO wall 102. It will be noted that the source-drain breakdown voltage BVdss, defined as the voltage where d(Ids)/d(Vds) becomes very large (i.e., where Ids versus Vds plots become nearly vertical), can be increased by biasing N-ISO wall 102. Viso is measured with respect to source/body terminal 89, which is ground potential. The increase in the breakdown voltage BVdss is indicative of improved RESURF charge balancing and is very desirable.

Figure 16:
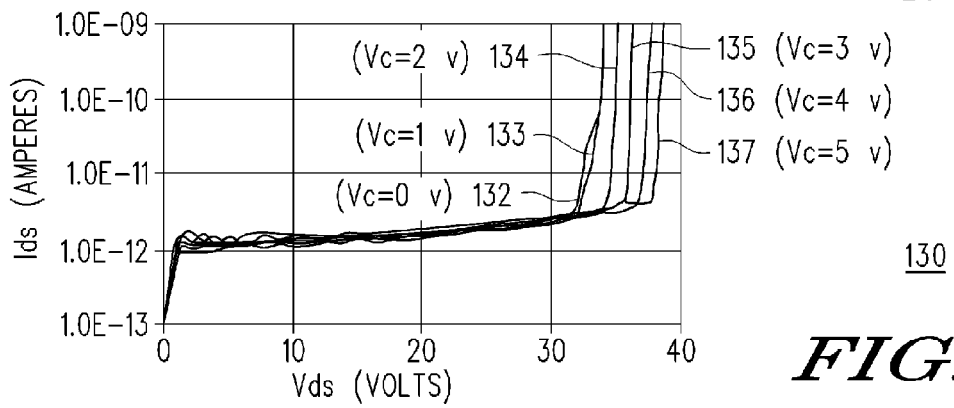
FIG. 16 is a is a plot of source-drain current Ids in Amperes as a function of the source-drain voltage Vds in volts for different values of control voltage Vc applied to a bridging transistor coupling the N ISO wall to the N DRIFT region of the device of FIGS. 10-13.

FIG. 16 shows plot 130 of source-drain current Ids in Amperes as a function of source-drain voltage Vds in volts, at constant gate voltage Vgs zero volts of device 80' of FIG. 12, for different values of control voltage Vc in volts on gate 116 of MOSFET bridge 104' of FIG. 12, without N-PLUG region 57. When MOSFET 110 is OFF, N-ISO wall 102 and N BL 82 are floating with respect to drain 92. Trace 132 corresponds to Vc=0 volts, trace 133 to Vc=1 volt, trace 134 to Vc=2 volts, trace 135 to Vc=3 volts, trace 136 to Vc=4 volts, and trace 137 to Vc=5 volts. Vc is measured with respect to source/body terminal 89 which is ground or reference potential. The source terminal of MOSFET 110 coupled to N ISO wall 102 (and therefore to N BL 82) follows the voltage of N+ drain 92 through the conductive channel of MOSFET 110 until the voltage on N+ drain 92 approaches voltage Vc-Vth where Vth is the threshold voltage of MOSFET 110, generally small. At that voltage, Viso (and Vnbl) is close to gate voltage Vc of MOSFET 110. In this situation, the conducting channel of MOSFET 110 pinches off and the voltage of N ISO wall 102 and N BL 82 are substantially pinned at Vc for small values of Vth.

Figure 18:
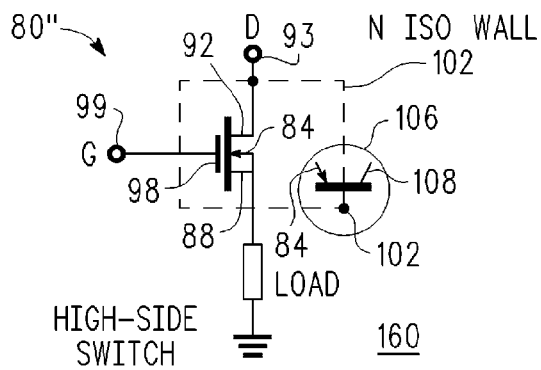
FIG. 18 is a simplified electrical schematic of a high side switch formed using the transistors illustrated physically in FIGS. 10-11, 12 and 14, including a parasitic PNP transistor that arises from the P BODY, N-ISO wall; and P substrate.

FIG. 17 shows plot 140 of voltage Vnbl in volts of N BL region 82 versus source-drain voltage Vds in volts, for different values of control voltage Vc in volts on gate 116 of MOSFET bridge 104' of FIG. 12, without N-PLUG region 57, and where N-ISO wall and NBL are Ohmically coupled. Trace 141 corresponds to Vc=0 volts, trace 142 to Vc=1 volt, trace 143 to Vc=2 volts, trace 144 to Vc=3 volts, trace 145 to Vc=4 volt, and trace 146 to Vc=5 volts. Vc is measured with respect to source/body terminal 93 which is at ground (reference) potential. It will be noted that the voltage of N BL region 82 can be varied by varying Vc and that the source-drain breakdown voltage BVdss can be increased by increasing Vc. As an additional advantage, the arrangement of FIG. 12 also suppresses parasitic transistor 106 formed by the combination of P BODY region 84, N ISO wall 102 and P Substrate 108 (see FIGS. 12, 14, 18). FIG. 18 is a simplified electrical schematic of a high side switch 160 formed from transistor 80' or 80" illustrated physically in FIGS. 10-11, 12 and 14, and showing parasitic PNP transistor 106 formed by the combination of P-BODY region 84, N-ISO wall 102 and P SUBSTRATE 108. Parasitic bipolar 106 is problematic when device 80', 80" is used as a high-side amplifier or switch. During the ON-state, because of low voltage drop between source and drain, the source potential goes high. With N ISO wall 102 and N BL 82 floating with respect to drain 92, the breakdown of N ISO wall 102 to P substrate 108 is determined by Vceo of the parasitic bipolar which is lower than Vcbo. The electrical tie between N DRIFT 90 (and drain 92) and N ISO wall 102 provided by bridge 104, shorts out the emitter—base junction of parasitic bipolar transistor 106, and as a result, the parasitic bipolar action is suppressed.

Figure 19:
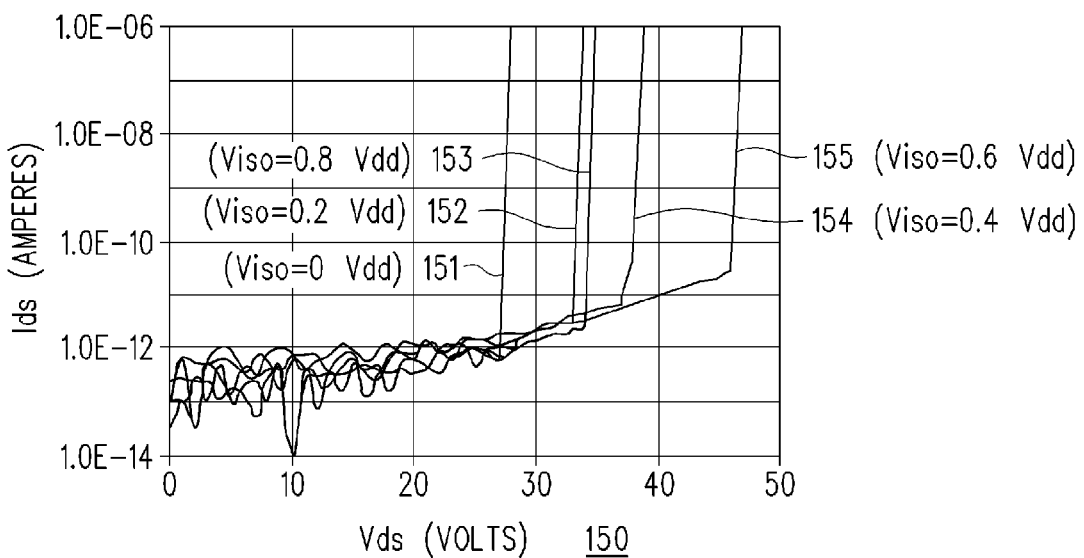
FIG. 19 is a is a plot of source-drain current Ids in Amperes as a function of the source-drain voltage Vds in volts for different values of voltage bias Viso applied to the N ISO wall of the device of FIG. 10, where Viso is derived from the drain voltage Vds.

FIG. 19 shows plot 150 of source-drain current Ids in Amperes as a function of the source-drain voltage Vds in volts, at constant gate voltage Vgs zero volts of device 80" of FIG. 14, for different values of voltage Viso in volts applied to N ISO wall 102 where Viso is derived from the drain voltage Vds. In the structure of device 80" of FIG. 14, N ISO wall 102 and N DRIFT region 90, 90' are coupled by bridge 104" comprising, for example, diffused region 120. N PLUG region 57 is not needed in the structure of transistor 80", but is not precluded in other embodiments. Trace 151 corresponds to Viso=Vdd, trace 152 to Viso=0.2 Vdd, trace 153 to Viso=0.8 Vdd, trace 154 to Viso=0.4 Vdd and trace 155 to Viso=0.6 Vdd. By changing one or more of the dimensions X, Y, Z of bridge 120 of FIG. 14, the percentage of Vds (or other voltage source) applied to N ISO wall 102 (and N BL 82) via bridge 104" can be changed, thereby improving the breakdown voltage BVdss identified by the voltage at which d(Ids)/d(Vds) becomes very large (i.e., nearly vertical Ids versus Vds trace). A further advantage of the configuration of transistor 80" is that it suppresses parasitic transistor 106 of FIGS. 12-14, and 18.

According to a first embodiment, there is provided a semiconductor device (40, 60, 80, 80', 80") employing RESURF charge balancing, comprising, a body region (44, 44', 84, 84'), a drift region (50, 50', 90, 90') located in the body region (44, 44', 84, 84'), a drain (52, 92) located in the drift region (50, 50', 90, 90'), a buried layer (42, 82) underlying the body region (44, 44', 84, 84'), a surrounding doped lateral isolation wall (102) Ohmically coupled to the buried layer (42, 82), wherein RESURF charge balancing is obtained by (i) including a doped sinker (57) coupled to the drain (52, 92) and extending through the drift region (50, 50', 90, 90') at least into the underlying body region (44, 44' 84, 84'), or (ii) directly or indirectly applying a bias voltage to the buried layer (42, 82), or (iii) a combination of (i) and (ii) above. According to a further embodiment, the device (40, 60, 80, 80', 80") further comprises a conductive bridge (104) coupling the drift region (50, 50', 90, 90') and the isolation wall (102) for applying a voltage to the buried layer (42, 82) for charge balancing, wherein a portion of voltage applied to the drain (52, 92) is coupled via the conductive bridge (104) and the isolation wall (102) to the buried layer (42, 82). According to a still further embodiment, the bridge (104') is a field effect transistor (110) having source-drain (113, 114) coupled between the drift region (50, 50', 90, 90') and the isolation wall (102) and a gate (106) adapted to receive a control voltage Vc for determining the voltage coupled to the buried layer (42,82) for charge balancing. According to a yet further embodiment, Vc is derived from a voltage source internal to a semiconductor die of which the semiconductor device (40, 60, 80, 80', 80") is a part. According to a still yet further embodiment, the bridge (104") is a resistance (120) whose magnitude can be varied by varying its dimensions (X, Y, Z) or doping or both. According to a yet still further embodiment, the resistance (120) comprises doped semiconductor. According to another embodiment, a voltage is applied to the buried layer (42, 82) by biasing the isolation wall (102) to provide charge balancing.

According to a second embodiment, there is provided a method for balancing charge in regions of a RESURF device (40, 60, 80, 80', 80"), comprising, providing a body region (44, 44'; 84, 84') of a first conductivity type, having a portion (44, 84) extending to a first surface (51, 91) and to a first depth (45, 85) from the first surface (51, 91), providing a source region (48, 88) of a second opposite conductivity type in the body region (44, 44'; 84, 84') proximate the first surface (51, 91), providing a drift region (50, 50', 90, 90') of a second opposite conductivity type in the body region (44, 44'; 84, 84') spaced apart from the source region (48, 88) and having a portion (50, 90) extending to the first surface (51, 91) and to a second depth (41, 81) less than the first depth (45, 85), providing a drain region (52, 92) of the second opposite conductivity type in the drift region (50, 50, 90, 90'), spaced apart from the body region (44, 44', 84, 84') and proximate the first surface (51, 91), and providing a plug region (57, 571, 572) of the second, opposite conductivity type, proximate to the drain region (52, 92) and extending to a depth exceeding the second depth (41, 81). According to a further embodiment, the step of providing the plug region (57, 571), further comprises providing the plug region (57, 571) extending into but not through the body region (44, 44', 88, 88'). According to a still further embodiment, the step of providing the plug region (57, 571) extending into but not through the body region (44, 44', 88, 88'), further comprises providing the plug region (57, 571) extending into the body region (44, 44', 88, 88') to within about 0.1 to 2 micrometers of the buried layer region (42, 82). According to a yet further embodiment, the step of providing the plug region (57, 572), further comprises providing the plug region (57, 572) extending through the body region (44, 44', 88, 88') so as to Ohmically contact the buried layer region (42, 82). According to a still yet further embodiment, the step of providing the plug region (57, 571, 572) further comprises, providing a plug region (57, 571, 572) having a doping level intermediate between a doping level of the drift region (50, 50', 90, 90') and the drain region (52, 92). According to a yet still further embodiment, the step of providing the plug region (57, 571, 572) further comprises, providing a plug region (57, 571, 572) having a graded doping density that deceases with depth from the first surface (51, 91).

According to a third embodiment, there is provided a method for controlling charge balancing in a RESURF device (40, 60, 80, 80', 80") having a source (48, 88) of a first conductivity type, a drift region (50, 50', 90, 90') of the first conductivity type, a drain region (52, 92) of the first conductivity type within the drift region (50, 50, 90, 90'), a body region (44, 44', 84, 84') of a second, opposite, conductivity type having a first portion (44, 84) between the source (48, 88) and the drift region (50, 50', 90, 90') and a second portion (44', 84') underlying the drift region (50, 50', 90, 90') and a buried layer region (42, 82) of the first conductivity type underlying the body region (44, 44', 88, 88'), the method comprising, forming an isolation wall (102) laterally surrounding the device (40, 60, 80, 80', 80") that is Ohmically coupled to the buried layer region (42, 82), forming a variable resistance bridge (104) between the isolation wall (102) and the drift region (50, 50', 90, 90'), and transmitting a portion of a voltage applied to the drain region (52, 92) to the isolation wall (102) and the buried layer region (42, 82) via the variable resistance bridge (104). According to a further embodiment, the step of forming the variable resistance bridge (104) further comprises forming a MOSFET (110) as the variable resistance bridge (104') wherein the resistance of the MOSFET 110 is determined at least in part by a control voltage Vc applied to a gate (116) of the MOSFET (110). According to a still further embodiment, the step of forming the variable resistance bridge (104) further comprises, forming a diffused or thin film bridge (104", 120) whose resistance is determined at least in part by its dimensions (X,Y,X) or doping or both.

According to a third embodiment, there is provided an LDMOS device (40, 60, 80, 80', 80"), comprising, a body region (44, 44', 84, 84'), a drift region (50, 50', 90, 90') located in the body region (44, 44', 84, 84'), a drain (52, 92) located in the drift region (50, 50', 90, 90'), a buried layer (42, 82) underlying the body region (44, 44', 84, 84'), a surrounding doped lateral isolation wall (102) Ohmically coupled to the buried layer (42, 82); and further comprising, a doped sinker (57) coupled to the drain (52, 92) and extending through the drift region (50, 50', 90, 90') at least into the underlying body region (44, 44' 84, 84'); or a variable resistance bridge (104) coupling the drift region (50, 50', 90, 90') and the isolation wall (102), and whose resistance is adapted to determine at least in part what portion of a voltage applied to the drain (52, 92) is coupled to the buried layer (42, 82). According to a further embodiment, the bridge (104) is a FET (110) whose source-drain (113, 114) couple the isolation wall (102) and drift region (50, 50', 90, 90') and whose gate (116) is adapted to receive control voltage Vc for adjusting the resistance of the FET (110). According to a still further embodiment, the bridge (104) is a resistor (120) whose cross-section (X, Y, Z) affects its resistance, which resistance is adapted to determine in part how much of a voltage applied to the drain is coupled to the buried layer (42, 82) via the isolation wall (102). According to a yet further embodiment, the doped sinker (57) is of the same conductivity type as the drain and has a doping intermediate between doping of the drift region (50, 50', 90, 90') and the drain (52, 92).

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A method for balancing charge in regions of a RESURF device, comprising: providing a body region of a first conductivity type, having a portion extending to a horizontal first surface and to a first depth from the first surface and having a buried layer of a second opposite conductivity type underlying the body region;

providing a source region of the second opposite conductivity type in the body region proximate the first surface;

providing a drift region of the second opposite conductivity type in the body region spaced apart from the source region and having a portion extending to the first surface and to a second depth less than the first depth;

providing a drain region of the second opposite conductivity type in the drift region, spaced apart from the body region and proximate the first surface, wherein a vertical side of the drain region facing the source region defines a lateral extent of the drain region; and providing a plug region of the second, opposite conductivity type, wherein a bottom of the plug region is lower than a bottom of the drain region and above the buried layer, the plug region vertically extends to a depth exceeding the second depth, a first portion of the plug region laterally extends toward the drift region beyond the lateral extent of the drain region, and a second portion of the plug region that is distinct from the first portion also laterally extends toward the drift region beyond the lateral extent of the drain region, thus increasing an effective drain area in a direction perpendicular to Ids current flow, wherein the plug region further includes a third portion that extends toward the drift region to a lateral extent that is not beyond the lateral extent of the drain region, wherein the third portion connects the first portion and the second portion, giving the plug region a lateral outline that has a corrugated shape.

2. The method of claim 1, wherein the step of providing the plug region, comprises providing the plug region extending into but not through the body region.

3. The method of claim 2, wherein the step of providing the plug region extending into but not through the body region, comprises providing the plug region extending into the body region to within about 0.1 to 2 micrometers of the buried layer.

4. The method of claim 1, wherein the step of providing the plug region comprises, providing a plug region having a doping level intermediate between a doping level of the drift region and the drain region.

5. The method of claim 1, wherein the step of providing the plug region comprises, providing a plug region having a graded doping density that decreases with depth from the first surface.

6. The method of claim 1, further comprising:
forming the buried layer underlying the body region.

7. The method of claim 1, further comprising:
forming a dielectric region within the drift region and between the source region and the drain region, wherein the plug region extends partially underneath the dielectric region.

8. The method of claim 1, wherein the depth of the plug region is less than a depth of the buried layer, so that a portion of the body region is located between the plug region and the buried layer.

9. The method of claim 1, wherein the first portion and the second portion define the plug region to have a lateral shape of isolated rectangles.

10. A method for balancing charge in regions of a RESURF device, comprising:
providing a body region of a first conductivity type, having a portion extending to a horizontal first surface and to a first depth from the first surface;

providing a source region of the second opposite conductivity type in the body region proximate the first surface;

providing a drift region of the second opposite conductivity type in the body region spaced apart from the source region and having a portion extending to the first surface and to a second depth less than the first depth;

providing a drain region of the second opposite conductivity type in the drift region, spaced apart from the body region and proximate the first surface, wherein a vertical side of the drain region facing the source region defines a lateral extent of the drain region; and providing a plug region of the second, opposite conductivity type, wherein a bottom of the plug region is lower than a bottom of the drift region, the plug region vertically extends to a third depth between the first depth and the second depth, and the plug region includes a first portion that extends toward the drift region to a first lateral extent that is beyond the lateral extent of the drain region, and a second portion connected to the first portion that extends toward the drift region to a second lateral extent that is not beyond the lateral extent of the drain region, thus increasing an effective drain area in a direction perpendicular to Ids current flow, wherein the plug region further includes a third portion that extends toward the drift region to a lateral extent that is not beyond the lateral extent of the drain region, wherein the third portion connects the first portion and the second portion, giving the plug region a lateral outline that has a corrugated shape.

11. The method of claim 10, wherein the plug region further includes a third portion that extends into the drift region to a third lateral extent that is beyond the lateral extent of the drain region, wherein the second portion connects the first portion and the third portion, giving the plug region a lateral outline that has a corrugated shape.

12. The method of claim 10, wherein the second lateral extent is before the lateral extent of the drain region.

13. The method of claim 10, wherein the plug region has a lateral outline with a corrugated shape.

14. The method of claim 10, wherein the plug region has a lateral outline with a globular shape.

* * * * *